United States Patent
Lin

(10) Patent No.: US 9,871,488 B2
(45) Date of Patent: Jan. 16, 2018

(54) DUAL-MODE POWER AMPLIFIER

(71) Applicant: QUALCOMM Incorporated, San Diego, CA (US)

(72) Inventor: Saihua Lin, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 316 days.

(21) Appl. No.: 14/608,121

(22) Filed: Jan. 28, 2015

(65) Prior Publication Data
US 2016/0218674 A1    Jul. 28, 2016

(51) Int. Cl.
| | |
|---|---|
| *H03F 1/02* | (2006.01) |
| *H03F 3/19* | (2006.01) |
| *H03F 3/217* | (2006.01) |
| *H04W 52/52* | (2009.01) |
| *H04W 52/02* | (2009.01) |

(Continued)

(52) U.S. Cl.
CPC ......... *H03F 1/0205* (2013.01); *H03F 1/0277* (2013.01); *H03F 3/19* (2013.01); *H03F 3/193* (2013.01); *H03F 3/217* (2013.01); *H03F 3/245* (2013.01); *H03F 3/45475* (2013.01); *H03F 3/72* (2013.01); *H03G 1/0088* (2013.01); *H03G 3/3042* (2013.01); *H04B 1/401* (2013.01); *H04W 52/0251* (2013.01); *H04W 52/52* (2013.01); *H03F 2200/09* (2013.01); *H03F 2200/411* (2013.01); *H03F 2200/451* (2013.01); *H03F 2200/507* (2013.01); *H03F 2203/21142* (2013.01); *H03F 2203/45554* (2013.01); *H03F 2203/45731* (2013.01); *H03F 2203/7236* (2013.01); *H03F 2203/7239* (2013.01); *H04W 88/06* (2013.01); *Y02B 60/50* (2013.01)

(58) Field of Classification Search
CPC . H03F 3/19; H03F 3/217; H03F 3/189; H03F 1/565; H03F 2200/534; H03F 2203/45556; H03F 2200/75; H03F 2203/45731; H03F 1/0227; H03F 3/45076; H03F 1/56; H04B 1/401; H04B 1/006; H04B 1/0053; H04W 52/0521; H03H 7/48
See application file for complete search history.

(56) References Cited

U.S. PATENT DOCUMENTS

| | | | |
|---|---|---|---|
| 5,060,294 A | 10/1991 | Schwent et al. | |
| 5,530,403 A * | 6/1996 | Bushman | H03F 3/45076 330/253 |

(Continued)

FOREIGN PATENT DOCUMENTS

| | | |
|---|---|---|
| EP | 2466748 A1 | 6/2012 |
| WO | WO-2011045312 A1 | 4/2011 |

OTHER PUBLICATIONS

International Search Report and Written Opinion—PCT/US2015/066207—ISA/EPO—Mar. 30, 2016.

*Primary Examiner* — James Yang
(74) *Attorney, Agent, or Firm* — Paradice and Li LLP/Qualcomm

(57) ABSTRACT

A method and apparatus for transmitting a communication signal through a dual-mode power amplifier may include amplifying a communication signal by a first amplifier and/or a second amplifier of the dual-mode power amplifier based on a desired transmit output power. The output of the first amplifier may be selectively coupled through a configurable inductive coupler to an antenna.

26 Claims, 5 Drawing Sheets

(51) Int. Cl.
*H04B 1/401* (2015.01)
*H03F 3/193* (2006.01)
*H03F 3/24* (2006.01)
*H03F 3/45* (2006.01)
*H03F 3/72* (2006.01)
*H03G 1/00* (2006.01)
*H03G 3/30* (2006.01)
*H04W 88/06* (2009.01)

(56) References Cited

U.S. PATENT DOCUMENTS

| | | | |
|---|---|---|---|
| 6,069,525 | A | 5/2000 | Sevic et al. |
| 6,765,802 | B1 * | 7/2004 | Ridley ............... H04S 1/00 361/760 |
| 7,944,296 | B1 * | 5/2011 | Lee ............... H03F 1/0277 330/154 |
| 8,340,598 | B2 | 12/2012 | Lee et al. |
| 2007/0188224 | A1 * | 8/2007 | Dow ............... H03F 1/14 330/129 |
| 2011/0171994 | A1 * | 7/2011 | Rajendran ............ H04B 1/006 455/552.1 |
| 2012/0286875 | A1 * | 11/2012 | Chan ............... H03F 3/189 330/295 |
| 2013/0116005 | A1 * | 5/2013 | Ganti ............... H04B 1/0053 455/552.1 |
| 2013/0222062 | A1 * | 8/2013 | Park ............... H03F 1/0227 330/251 |
| 2013/0265108 | A1 * | 10/2013 | Dieter ............... H03F 1/0277 330/252 |
| 2014/0084700 | A1 | 3/2014 | Anderson et al. |
| 2014/0167857 | A1 | 6/2014 | Jenkins et al. |

* cited by examiner

DUAL-MODE POWER AMPLIFIER

TECHNICAL FIELD

The example embodiments relate generally to power amplifiers, and specifically to a dual-mode power amplifier.

BACKGROUND OF RELATED ART

A wireless device may send data to other wireless devices by transmitting communication signals carrying encoded data. Transmit output power of the wireless device may vary due to transmitter configuration, proximity of the other wireless devices, and/or other operating conditions. For example, when a first wireless device transmits signals to a relatively nearby second wireless device, a relatively low transmit output power may be used. In contrast, when the first wireless device transmits signals to a relatively distant second wireless device, a relatively high transmit output power may be used. In addition, transmit output power limits may be set forth by specifications such as the IEEE 802.11 specification or a BLUETOOTH® specification from the BLUETOOTH Special Interest Group.

A wireless device may use a power amplifier to amplify and transmit communication signals to the other wireless devices. Power amplifier efficiency is a measure of the ability of the power amplifier to convert source power (e.g., power supplied to the power amplifier) to transmit output power. Power amplifier efficiency may vary across a range of transmit output power levels. That is, a power amplifier may operate less efficiently at some transmit output power levels than at other transmit output power levels. Inefficient power amplifier operation may generate excessive heat and may reduce the battery life of the wireless device.

Thus, there is a need to improve power amplifier efficiency in wireless devices, particularly when transmitting signals with multiple transmit output power levels.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A device and method of transmitting a communication signal via a dual-mode power amplifier is disclosed. In accordance with some embodiments, the dual-mode power amplifier may include a first amplifier, a second amplifier, and an inductive coupler to couple outputs from the first amplifier and the second amplifier to an output of the dual-mode power amplifier. The first amplifier may amplify an intermediate differential signal and generate a single-ended output signal through an output terminal of the first amplifier when operating in a first operating mode. The first amplifier may couple the output terminal of the first amplifier to ground when operating in a second operating mode. The second amplifier may amplify the intermediate differential signal and generate a differential output signal when operating in the second operating mode.

In accordance with other embodiments, a wireless communication device may include a first transceiver coupled to a dual-mode power amplifier. The dual-mode power amplifier may include a first amplifier, a second amplifier, and an inductive coupler. The first amplifier may amplify an intermediate differential signal and generate a single-ended output signal through an output terminal of the first amplifier when operating in a first operating mode. The first amplifier may couple the output terminal of the first amplifier to ground when operating in a second operating mode. The second amplifier may amplify the intermediate differential signal and generate a differential output signal when operating in the second operating mode.

BRIEF DESCRIPTION OF THE DRAWINGS

The present embodiments are illustrated by way of example and are not intended to be limited by the figures of the accompanying drawings. Like numbers reference like elements throughout the drawings and specification.

DETAILED DESCRIPTION

The present embodiments are described below in the context of Wi-Fi enabled devices for simplicity only. It is to be understood that the present embodiments are equally applicable for devices using signals of other various wireless standards or protocols. As used herein, the terms "wireless local area network (WLAN)" and "Wi-Fi" may include communications governed by the IEEE 802.11 standards, BLUETOOTH®, HiperLAN (a set of wireless standards, comparable to the IEEE 802.11 standards, used primarily in Europe), and other technologies used in wireless communications (e.g., ZigBee and WiGig).

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

Figure 1:
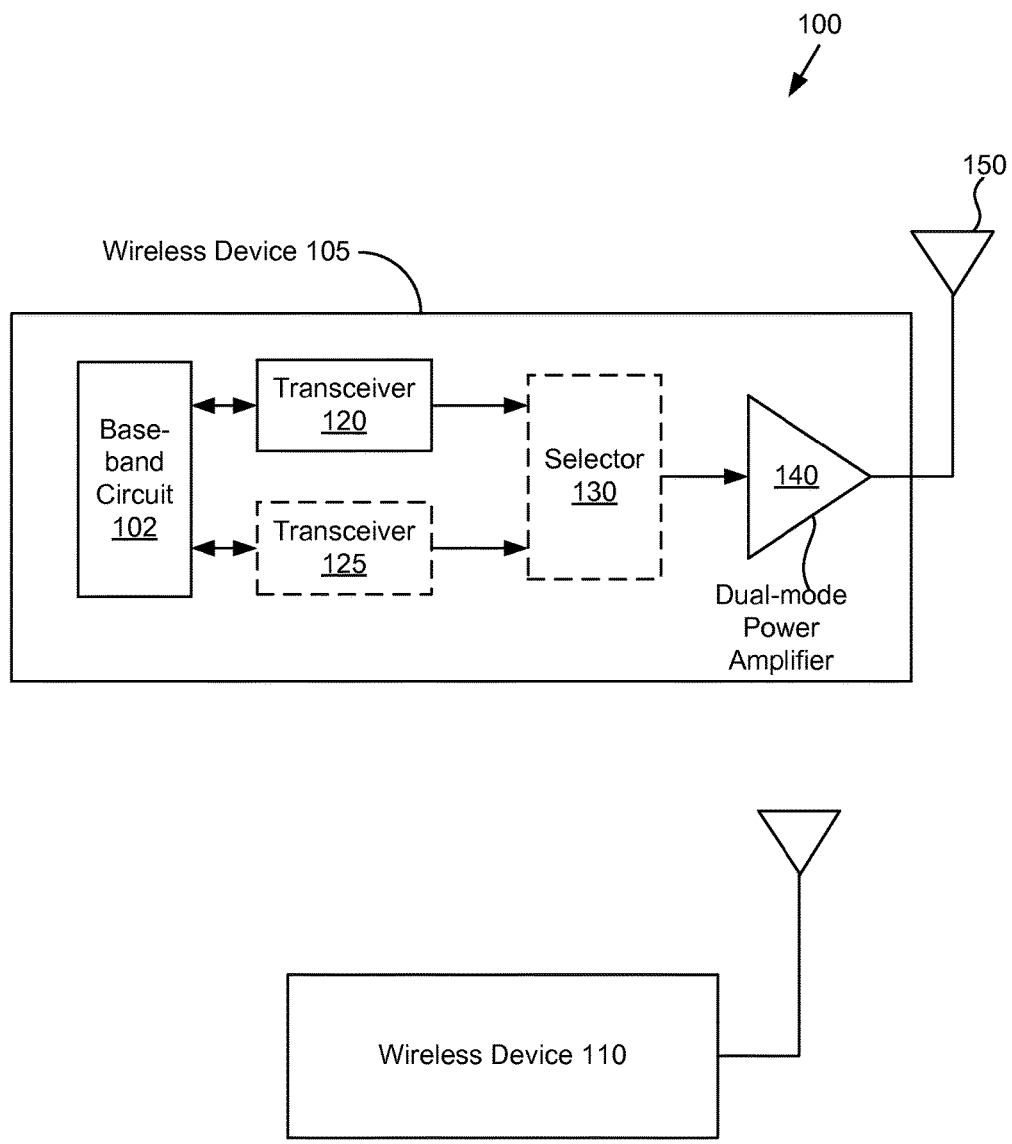
FIG. 1 depicts an example wireless system within which the example embodiments may be implemented.

FIG. 1 depicts an example wireless system 100 within which the example embodiments may be implemented.

Wireless system 100 includes wireless devices 105 and 110. Although only two wireless devices 105 and 110 are shown for simplicity, wireless system 100 may include any number of wireless devices. Communication signals may be transmitted between wireless devices 105 and 110.

Wireless device 105 may include base-band circuit 102, transceiver 120, dual-mode power amplifier 140, and antenna 150. Although not shown for simplicity, wireless device 105 may include a plurality of antennas. Base-band circuit 102 may provide data to be transmitted to and/or receive data from one or more other devices via transceiver 120 and antenna 150. Transceiver 120 is coupled to base-band circuit 102, and may generate communication signals according to a communication protocol such as, but not limited to, Wi-Fi, BLUETOOTH, near-field communication, Zig-Bee, or any other feasible communication protocol. Communication signals generated by transceiver 120 are provided to dual-mode power amplifier 140. Dual-mode power amplifier 140 may amplify the communication signals based, at least in part, on a desired transmit output power. Amplified communication signals are provided from dual-mode power amplifier 140 to antenna 150 for wireless transmission.

In some embodiments, wireless device 105 may include an additional transceiver 125 and a selector 130. Transceiver 125, which is also coupled to base-band circuit 102, may generate communication signals according to a different communication protocol, compared to transceiver 120. For example, transceiver 120 may generate Wi-Fi communication signals while transceiver 125 may generate BLUETOOTH communication signals. Selector 130 may couple transceiver 120 and/or transceiver 125 to dual-mode power amplifier 140. In some embodiments, transceiver 125 and selector 130 may be optional within wireless device 105. In some embodiments, wireless device 105 may include three or more transceivers. Wireless device 110 may include one or more transceivers, a selector, and a dual-mode power amplifier (not shown for simplicity) similar to those depicted in wireless device 105.

Figure 2:
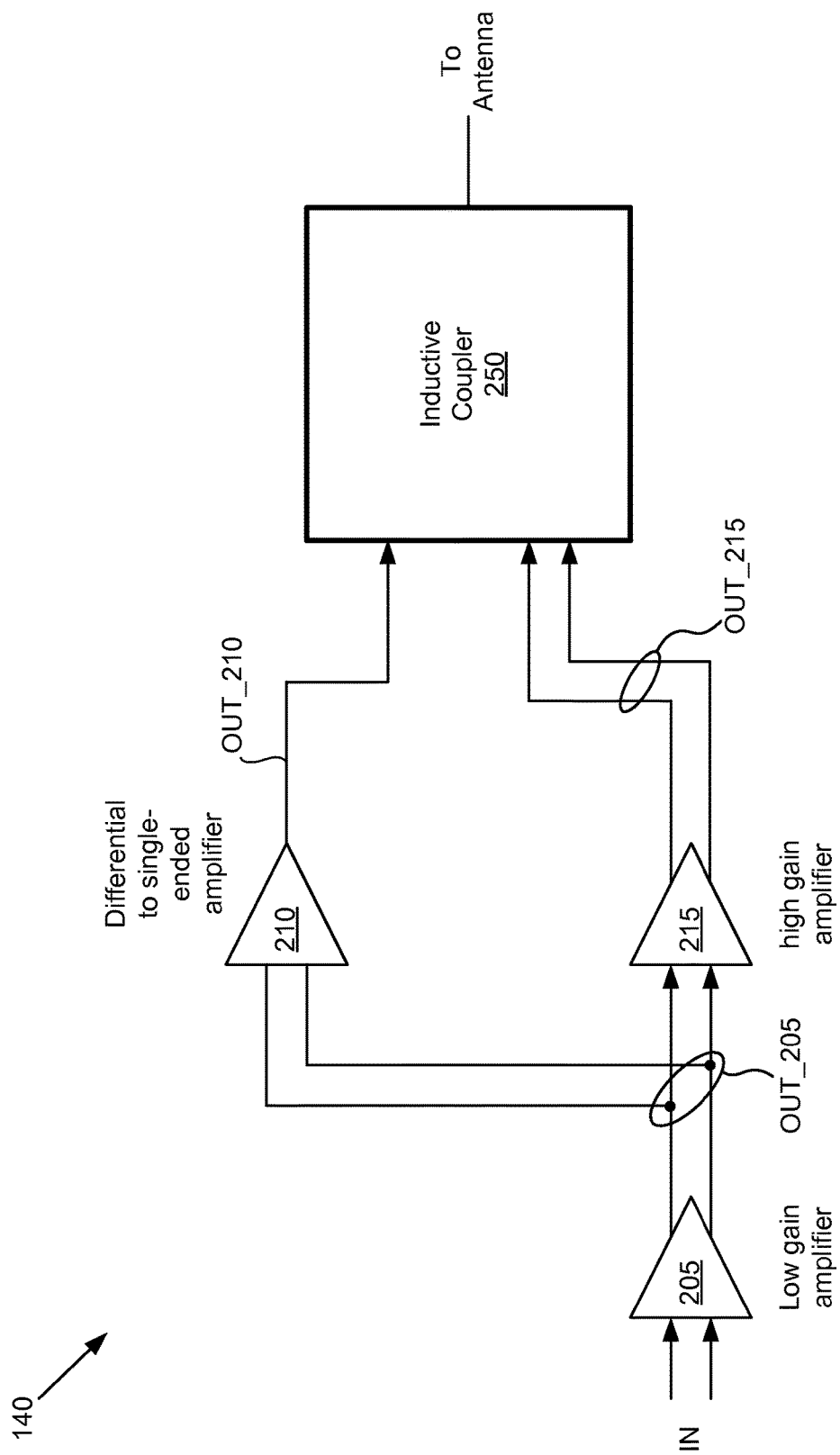
FIG. 2 shows an example embodiment of a dual-mode power amplifier.

FIG. 2 shows an example embodiment of dual-mode power amplifier 140 of FIG. 1. Dual-mode power amplifier 140 may include a first amplifier 205, a second amplifier 210, a third amplifier 215, and an inductive coupler 250. Other embodiments of dual-mode power amplifier 140 may include other numbers of amplifiers such as two amplifiers or more than three amplifiers. An input communication signal (IN), such as a differential communication signal, may be received by first amplifier 205. First amplifier 205 may have relatively low gain (e.g., output power) levels, such as an output power level less than or equal to 9 dBm. In some embodiments, relatively low output power levels may be suitable for transmitting BLUETOOTH signals or relatively low power Wi-Fi signals. First amplifier 205 may output intermediate differential signal OUT_205 in response to the input differential signal IN. Second amplifier 210 may be designed to provide a relatively low output power level, and may also convert the differential input signal IN into a single-ended output signal OUT_210. For example, second amplifier 210 may provide a single-ended output signal with one (1) dBm of output power yielding a net output power level of 10 dBm (9 dBm from first amplifier 205 plus 1 dBm from second amplifier 210).

Third amplifier 215 may provide between approximately 8-12 dBm of output power yielding a net output power level of between approximately 17-20 dBm (9 dBm from first amplifier 205 plus between approximately 8-11 dBm from third amplifier 215). In some embodiments, the output power levels from third amplifier 215 may be suitable for transmitting relatively high power Wi-Fi signals. In some embodiments, output signal OUT_215 from third amplifier 215 may be differential.

Dual-mode power amplifier 140 may select at least one of first amplifier 205, second amplifier 210, and/or third amplifier 215 to amplify the communication signal IN based, at least in part, on the desired transmit output power. In some embodiments, the desired transmit output power may be based on the protocol (e.g., type) of the communication signal to be transmitted. For example, BLUETOOTH communication signals or low-power Wi-Fi communication signals may be associated with a relatively low desired transmit output power. First amplifier 205 and second amplifier 210 may be optimized to operate at relatively low transmit output power levels. Thus, when operating in a low-power mode to provide a relatively low desired transmit output power, first amplifier 205 and second amplifier 210 may be selected to amplify the communication signal IN. In another example, a Wi-Fi communication signal may be associated with a relatively high desired transmit output power. First amplifier 205 and third amplifier 215 may be optimized to operate at relatively high transmit output power levels. Thus, when operating in a high-power mode to provide a relatively high desired transmit output power, first amplifier 205 and third amplifier 215 may be selected to amplify the communication signal IN.

Inductive coupler 250 may receive output signals OUT_210 and OUT_215 from second amplifier 210 and third amplifier 215 respectively, and may selectively couple second amplifier 210 or third amplifier 215 to antenna 150 based on the operating mode of dual-mode power amplifier 140. In some embodiments, selection of the operating mode may be based on the desired transmit output power. For example, when operating in the high-power mode to provide a relatively high desired transmit output power, inductive coupler 250 may couple third amplifier 215 to antenna 150. When operating in a low-power mode to provide a relatively low desired transmit output power, inductive coupler 250 may couple second amplifier 210 to antenna 150. Operation of dual-mode power amplifier 140 and inductive coupler 250 is described in more detail below in conjunction with FIG. 3.

Figure 3:
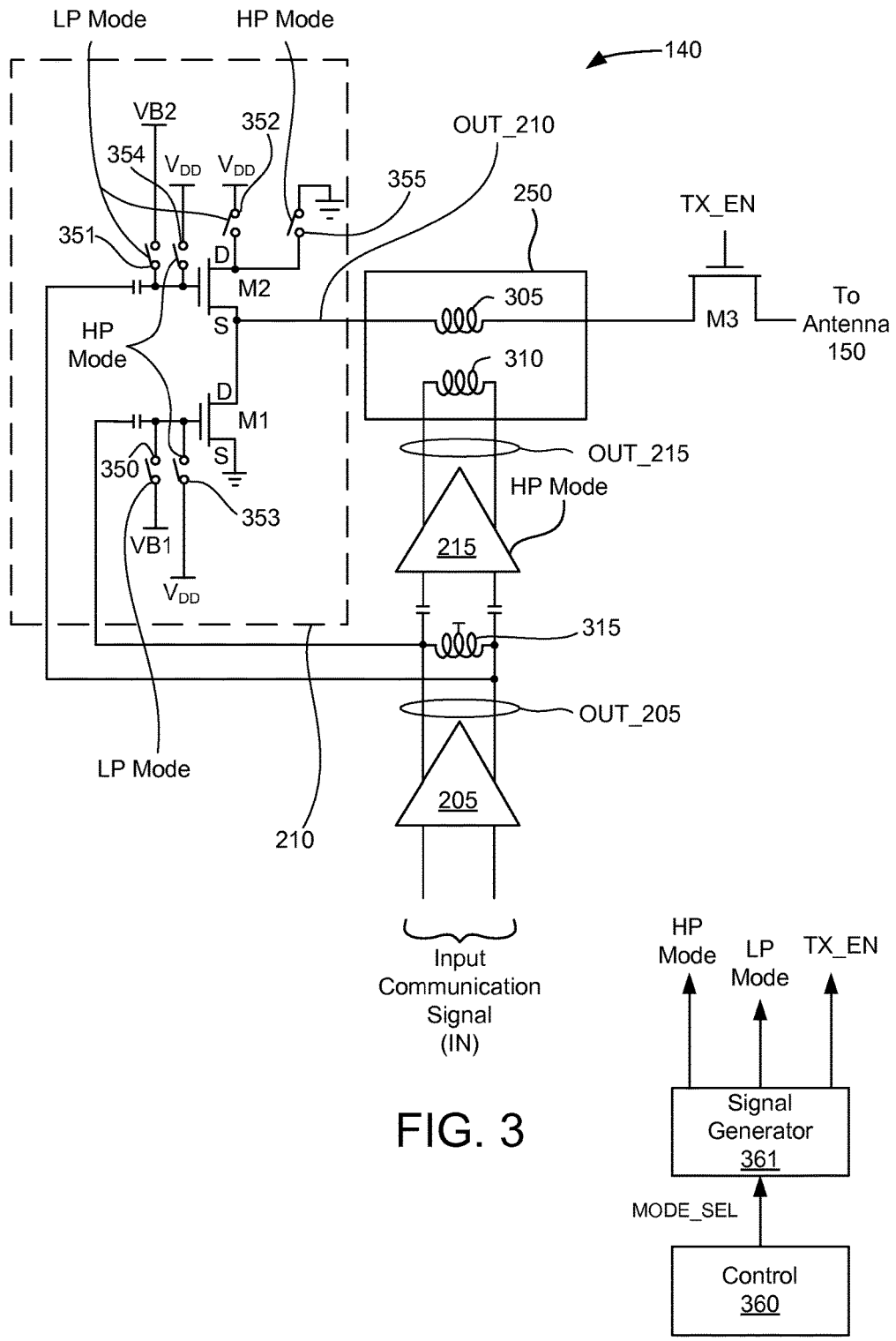
FIG. 3 shows another example embodiment of a dual-mode power amplifier.

FIG. 3 shows another example embodiment of dual-mode power amplifier 140. Dual-mode power amplifier 140 includes first amplifier 205, second amplifier 210, third amplifier 215, inductive coupler 250, a control block 360, and a signal generator 361. Input communication signals (IN) provided to dual-mode power amplifier 140 are received by first amplifier 205. In some embodiments, communication signals received by first amplifier 205 may be differential signals (although for other embodiments, first amplifier 205 may be configured to receive single-ended input signals).

First amplifier 205 may provide relatively low amounts of gain. For example, in some embodiments, first amplifier 205 may provide output power levels of approximately 9 dBm. An output inductor 315 may be coupled across an output of first amplifier 205. In some embodiments, output inductor 315 may include a center tap that may be coupled to a reference voltage such as VDD. First amplifier 205 may generate an intermediate differential output signal OUT_205 that may be AC coupled to an input of second amplifier 210 and to an input of third amplifier 215. Outputs of second amplifier 210 and third amplifier 215 may be coupled to inductive coupler 250.

Second amplifier 210 may provide relatively low amounts of gain, compared to first amplifier 205. For example, in some embodiments, second amplifier 210 may provide an output power level of 1 dBm. Second amplifier 210 may include a first transistor M1, a second transistor M2, and switches 350-355. In some embodiments, M1 and M2 may be NMOS transistors. In other embodiments, M1 and M2 may be any technically feasible transistors. When operating in the low-power mode, a low-power mode signal (LP mode) may be asserted (e.g., driven to a logic high) to control switches, switch assemblies, switch units or the like within second amplifier 210. For example, the asserted LP mode signal may cause switch 350 to couple a gate terminal of M1 to a first bias voltage (VB1), may cause switch 351 to couple a gate terminal of M2 to a second bias voltage (VB2), and may cause switch 352 to couple a drain terminal of M2 to a supply voltage, such as VDD. In some embodiments, VB1 may be approximately 100 millivolts to 200 millivolts greater than a threshold voltage (e.g., a turn on voltage) associated with transistor M2. In some embodiments, VB2 may a reference voltage supplied through a resistor (not shown for simplicity). For example, VB2 may be VDD supplied through a 5,000 or a 10,000 ohm resistor. In some embodiments, these voltages may configure M1 and M2 to operate in a saturation mode (e.g., operate M1 and M2 in the saturation region). When operating in the saturation mode, M1 may operate as a common drain amplifier providing positive gain, and M2 may operate as a common source amplifier providing negative gain. Thus, when operating in the saturation mode, M1 and M2 may receive the intermediate differential output signal OUT_205 from first amplifier 205, and generate a single-ended output signal OUT_210 at the output of second amplifier 210 (e.g., at the source of M2) through a first inductor 305 (operating as an output inductor) of inductive coupler 250. Since first amplifier 205 is AC coupled to second amplifier 210, intermediate differential output signal OUT_205 may not be affected by bias voltages coupled to the gate terminals of M1 and M2.

Third amplifier 215 may provide relatively high amounts of gain. For example, in some embodiments, third amplifier 215 may provide an output power level between 8-12 dBm. Third amplifier 215 may receive the intermediate differential output signal OUT_205 and may provide a differential output signal OUT_215 to a second inductor 310 of inductive coupler 250.

Inductive coupler 250 may selectively couple the output of second amplifier 210 and the output of third amplifier 215 to antenna 150 (not shown for simplicity) based on the operating mode of dual-mode power amplifier 140. In some embodiments, inductive coupler 250 may be coupled to antenna 150 through a pass transistor M3. In some embodiments, pass transistor M3 may allow dual-mode power amplifier 140 to be isolated from antenna 150 to reduce interference with a receiver (not shown for simplicity) when wireless device 105 (within which dual-mode power amplifier 140 is provided, as depicted in FIG. 1) is trying to receive a communication signal through antenna 150.

When operating in the high-power mode, second amplifier 210 may couple the output of first amplifier 205 to ground to form a balun with first inductor 305 within inductive coupler 250. In some embodiments, a high-power mode signal (HP mode) may be asserted (e.g., driven to a logic high) to control switches, switch assemblies, switch units or the like within second amplifier 210. For example, the asserted HP mode signal may cause switch 353 to couple the gate terminal of M1 to a supply voltage and may cause switch 354 to couple the gate terminal of M2 to the same supply voltage. In some embodiments, the supply voltage may be VDD. Additionally, the asserted HP mode signal may cause switch 355 to couple the drain of M2 to ground. These voltages may configure M1 and M2 to operate in a triode mode (e.g., operate M1 and M2 in the triode region), and may couple the output of second amplifier 210 to ground. In some embodiments, the asserted HP mode signal may cause switch 353 and switch 354 to couple the gate terminal of M1 and the gate terminal of M2 to any technically feasible voltage sufficient to operate M1 and M2 in the triode mode. For example, switch 353 and switch 354 may couple the gate terminal of M1 and the gate terminal of M2 to a voltage that is 1000 millivolts greater than the associated threshold voltages.

Thus, inductive coupler 250 may couple a single-ended output signal (from second amplifier 210) or a differential output signal (from third amplifier 215) to antenna 150. For example, when operating in the low-power mode, second amplifier 210 may be coupled through inductive coupler 250 (e.g., through first inductor 305) to antenna 150. When operating in the high-power mode, third amplifier 215 may be coupled through inductive coupler 250 (e.g., through first inductor 305 configured as a balun and second inductor 310) to antenna 150. In some embodiments, the HP mode control signal, when asserted, may enable third amplifier 215 to amplify the differential intermediate output signal OUT_205. When the HP mode control signal is not asserted, output signals from third amplifier 215 may be coupled to ground to isolate second inductor 310 from first inductor 305.

In some embodiments, the HP mode signal and the LP mode signal may be based, at least in part, on the operating mode of dual-mode power amplifier 140, and may be generated by a hardware or firmware based controller or by a processor executing a software program or routine. In some embodiments, the HP mode signal and the LP mode signal may be generated by signal generator 361 in response to a mode select signal (MODE_SEL), as described in more detail below.

In some embodiments, dual-mode power amplifier 140 may include control block 360 and signal generator 361. Control block 360 may generate the MODE_SEL signal to cause the dual-mode power amplifier 140 to operate either in the high-power mode or the low-power mode, as described above. In some embodiments, control block 360 may drive the MODE_SEL signal to a first state to operate the dual-mode power amplifier 140 in the low-power mode when the desired transmit output power is less than a threshold. In another embodiment, control block 360 may drive the MODE_SEL signal to a second state to operate the dual-mode power amplifier 140 in the high-power mode when the desired transmit output power is greater than a threshold. Signal generator 361 may receive the MODE_SEL signal and, in response thereto, may generate the HP mode signal and the LP mode signal. In some embodiments, generation of the MODE_SEL signal may be based, at least in part, on a desired output transmit power level. In one embodiment, the desired output transmit power level may be based upon whether second amplifier 210 or third amplifier 215 is selected to amplify the intermediate differential output signal OUT_205. In another embodiment, the desired output transmit power level may be based upon whether Bluetooth signals or Wi-Fi signals are to be transmitted from wireless device 105 via antenna 150. Thus, the MODE_SEL signal may be generated in response to whether second amplifier 210 or third amplifier 215 is to amplify the intermediate differential output signal OUT_205. For example, the MOD- E_SEL signal may be generated based upon using transceiver 120 or transceiver 125 (see also FIG. 1), and/or based upon a protocol (e.g., Bluetooth or Wi-Fi) of the communication signal to be transmitted to another device. In some embodiments, a transmit enable signal TX_EN may be asserted when either the HP mode signal or the LP mode signal is asserted. When asserted, TX_EN may couple inductive coupler 250 to antenna 150. A possible relationship between the low-power mode, the high-power mode, the function of first inductor 305, the states of switches 351-355, and possible output transmit power levels is shown below in Table 1.

TABLE 1

| Mode | Inductor 305 function | Switch 350/351/352 | Switch 353/354/355 | Transmit Power |
|---|---|---|---|---|
| 1 | Output Inductor | Closed | Open | Low |
| 2 | Balun | Open | Closed | High |

Figure 4:
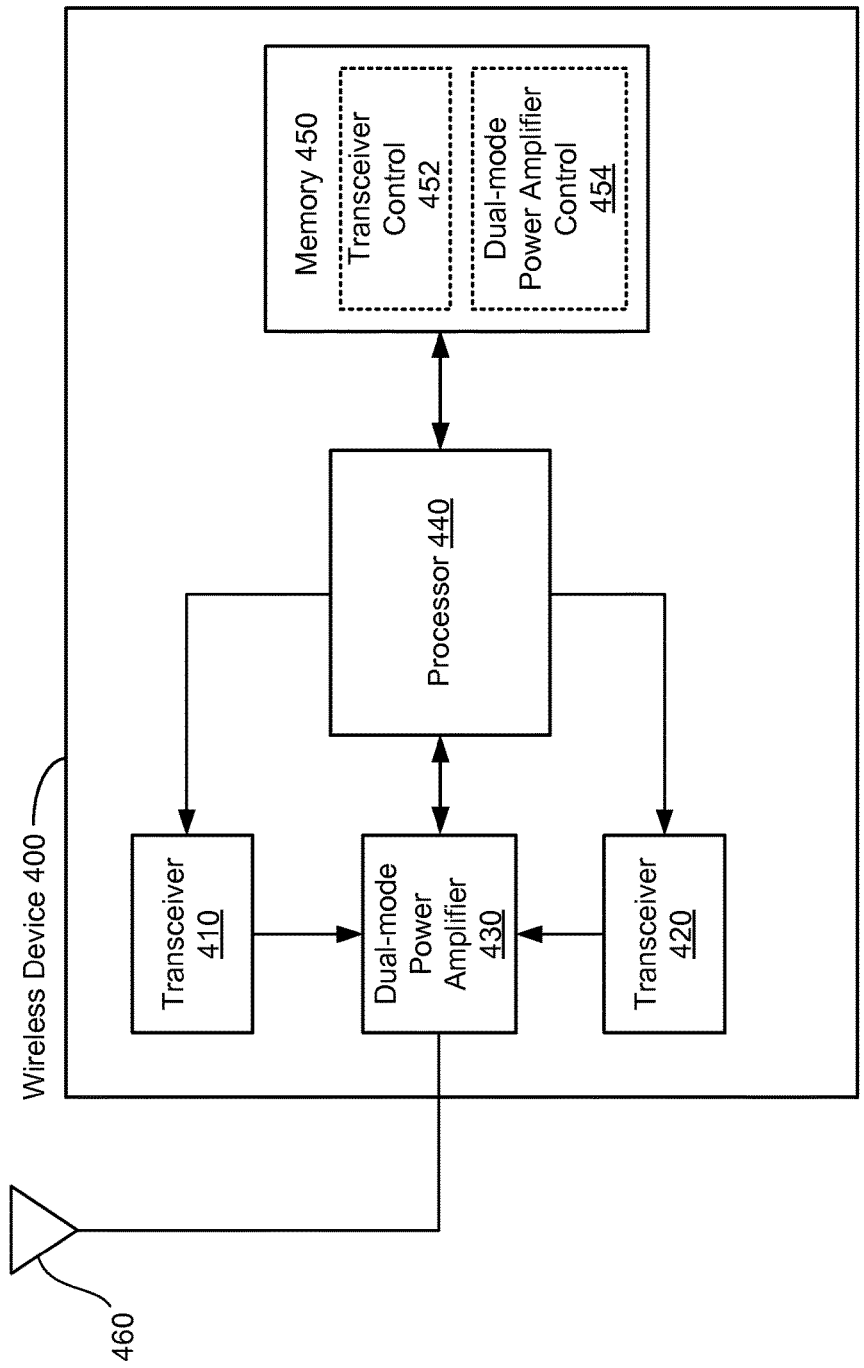
FIG. 4 shows a wireless device that is one embodiment of the wireless devices of FIG. 1.

FIG. 4 shows a wireless device 400 that is one embodiment of wireless device 105 and/or wireless device 110 of FIG. 1. Wireless device 400 includes a first transceiver 410, a second transceiver 420, a dual-mode power amplifier 430, a processor 440, a memory 450, and an antenna 460 (only one antenna shown for simplicity). Transceivers 410 and 420 may transmit and receive communication signals. Dual-mode power amplifier 430 is coupled to transceiver 410 and transceiver 420, and may amplify communication signals provided by transceivers 410 and/or 420. For some embodiments, dual-mode power amplifier 430 may be the dual-mode power amplifier 140 of FIG. 3.

Memory 450 may include a non-transitory computer-readable storage medium (e.g., one or more nonvolatile memory elements, such as EPROM, EEPROM, Flash memory, a hard drive, etc.) that may store the following software modules:
  transceiver control module 452 to control transceivers 410 and 420 to transmit and receive communication signals in accordance with one or more communication protocols, and
  dual-mode power amplifier control module 454 to select and/or amplify one or more communication signals from transceivers 410 and 420, and to provide the amplified communication signals to antenna 460.
Each software module includes program instructions that, when executed by processor 440, may cause wireless device 400 to perform the corresponding function(s). Thus, the non-transitory computer-readable storage medium of memory 450 may include instructions for performing all or a portion of the operations of FIG. 5.

Processor 440, which is coupled to transceivers 410 and 420, dual-mode power amplifier 430, and memory 450, may be any one or more suitable processors capable of executing scripts or instructions of one or more software programs stored in wireless device 400 (e.g., within memory 450).

Processor 440 may execute transceiver control module 452 to configure transceivers 410 and 420 to receive and/or transmit communication signals in accordance with a selected or desired communication protocol. In some embodiments, transceivers 410 and 420 may each operate according to different communication protocols.

Processor 440 may execute dual-mode power amplifier control module 454 to select a communication signal from one of transceivers 410 and 420, determine a desired transmit output power, configure dual-mode power amplifier 430 to amplify the selected communication signal to the desired transmit output power, and/or provide the amplified communication signal to the antenna 460.

Figure 5:
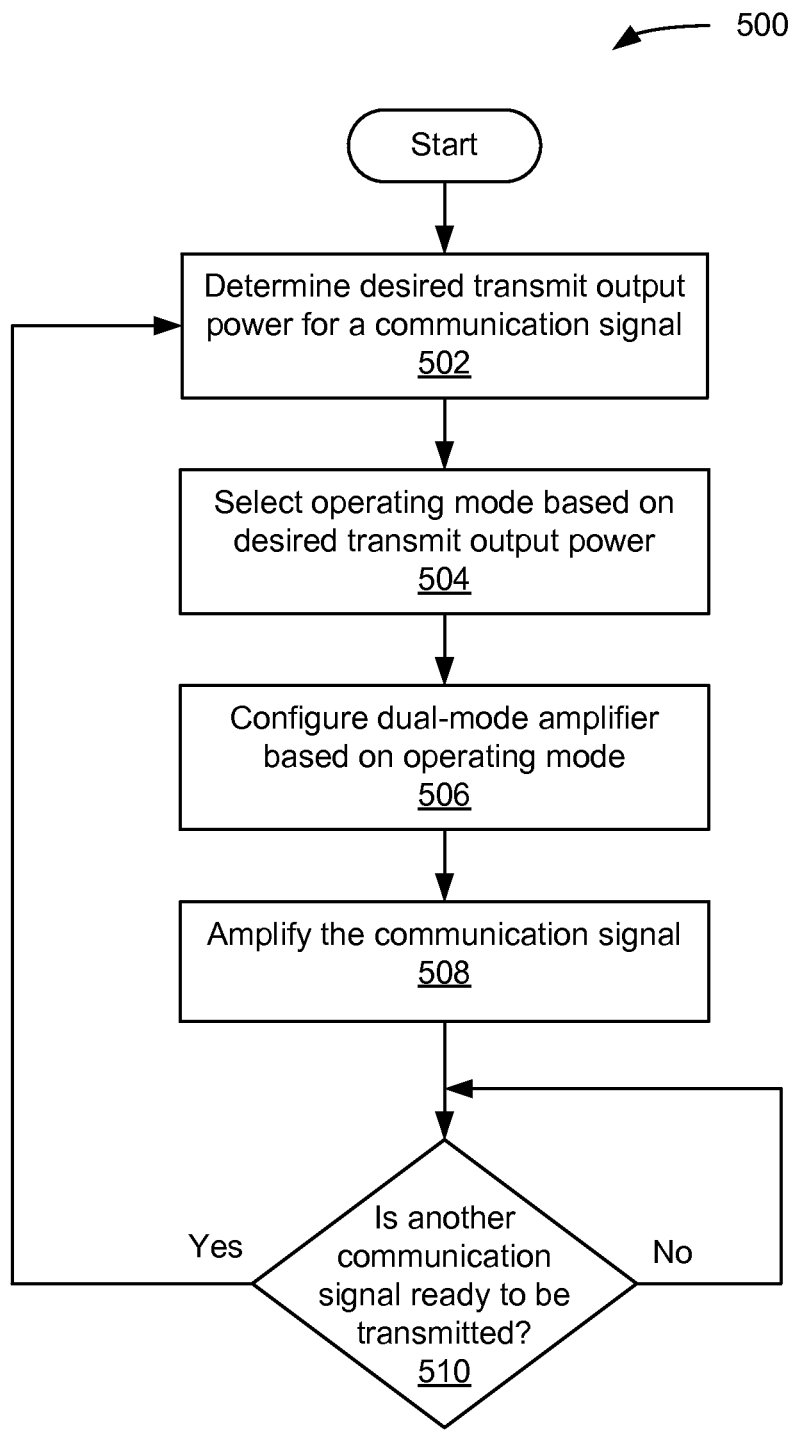
FIG. 5 shows an illustrative flow chart depicting an example operation for transmitting a communication signal in accordance with some embodiments.

FIG. 5 shows an illustrative flow chart depicting an example operation 500 for transmitting a communication signal in accordance with some embodiments. Some embodiments may perform the operations described herein with additional operations, fewer operations, operations in a different order, operations in parallel, and/or some operations differently. Referring also to FIGS. 1 and 2, wireless device 105 determines a desired transmit output power to transmit a communication signal (502). In some embodiments, wireless device 105 may determine the desired transmit output power based, at least in part, on the communication signal to be transmitted. For example, a BLUETOOTH communication signal may have a relatively low desired transmit output power, while a Wi-Fi communication signal may have a relatively high desired transmit output power. The desired transmit output power may also be determined by operating conditions, received signal strength indicator (RSSI) values, link budget and/or other technically feasible means.

Next, an operating mode is selected based on the desired transmit output power (504). For example, wireless device 105 may select the low-power mode to transmit relatively low power communication signals, and may select the high-power mode to transmit relatively high-power communication signals. In some embodiments, when the desired transmit output power is less than a threshold, the low-power mode may be selected. Additionally, when the desired transmit output power is greater than or equal to the threshold, then the high-power mode may be selected. In some embodiments, one or more mode control signals may be generated based on the selected operating mode. For example, signal generator 361 may generate the HP mode, LP mode, and TX_EN mode control signals based on the selected operating mode (e.g., as indicated by the MODE_SEL signal).

For ease of explanation, an example of a low power communication signal may be a BLUETOOTH signal and an example of a high power communication signal may be a Wi-Fi signal. If a relatively low power (e.g., less than a threshold level) BLUETOOTH signal is to be transmitted by wireless device 105, then the low-power mode may be selected and first amplifier 205 and second amplifier 210 may amplify the BLUETOOTH signal for transmission via antenna 150. On the other hand, if a relatively high-power (greater than or equal to the threshold level) Wi-Fi signal is to be transmitted by wireless device 105, then the high-power mode may be selected and first amplifier 205 and third amplifier 215 may amplify the Wi-Fi signal for transmission via antenna 150.

Next, dual-mode power amplifier 140 may be configured based on the selected operating mode (506). As described above, the HP mode, the LP mode, and the TX_EN signals may be generated by signal generator 361 in response to a selected operating mode. In response to the HP mode, the LP mode, and/or the TX_EN signals, one or more transistors within dual-mode power amplifier 140 may be biased to couple either second amplifier 210 or third amplifier 215 to antenna 150 through inductive coupler 250.

For example, when the MODE_SEL signal indicates the low-power mode, the HP mode signal may not be asserted causing switches 353-355 to remain open (e.g., not conduct). The LP mode signal may be asserted causing switch 350, switch 351, and switch 352 to couple voltages VB1, VB2, and VDD respectively to transistors M1 and M2 as shown in FIG. 3. Thus, switches 351-352 may bias transistors M1 and M2 to operate in the saturation mode. The TX_EN signal may be asserted and may cause transistor M3 to couple inductive coupler 250 to antenna 150. In another example, when the MODE_SEL signal indicates the high-power mode, the LP mode signal may not be asserted causing switches 350-352 to remain open. The HP mode signal may be asserted causing switch 353, switch 354, and switch 355 to couple voltages VDD, VDD, and GND respectively to transistors M1 and M2 as shown in FIG. 3. Thus, switches 353-355 may bias transistors M1 and M2 to operate in the triode mode. The TX_EN signal may be asserted and may cause transistor M3 to couple inductive coupler 250 to antenna 150.

Next, the communication signal is amplified by dual-mode power amplifier 140 (508). In some embodiments, the communication signal may be amplified by first amplifier 205, second amplifier 210, and/or third amplifier 215, based on the selected operation mode.

Next, wireless device 105 determines if another communication signal is ready to be transmitted via antenna 150 to another device (510). If another communication signal is ready to be transmitted, then processing continues at 502. If there are no other communication signals ready to be transmitted, then wireless device 105 waits for another communication signal at 510.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A dual-mode power amplifier, comprising:
a first amplifier configured to amplify an intermediate differential signal and generate a single-ended output signal at an output terminal of the first amplifier when operating in a first operating mode, and configured to couple the output terminal of the first amplifier to ground when operating in a second operating mode, the first amplifier comprising:
a first NMOS transistor comprising a drain terminal coupled to at least one from the group consisting of a supply voltage and a ground, and a source terminal coupled to the output terminal of the first amplifier; and
a second NMOS transistor comprising a drain terminal coupled to the source terminal of the first NMOS transistor and a source terminal coupled to ground; and
a second amplifier configured to amplify the intermediate differential signal and generate a differential output signal at output terminals of the second amplifier when operating in the second operating mode; and
an inductive coupler comprising:
a first inductor including a first terminal directly coupled to the output terminal of the first amplifier and a second terminal coupled to an antenna; and
a second inductor directly coupled across the output terminals of the second amplifier.

2. The dual-mode power amplifier of claim 1 further comprising bias circuitry configured to bias the first NMOS transistor and the second NMOS transistor to be in a saturation region when operating in the first operating mode and bias the first NMOS transistor and the second NMOS transistor to be in a triode region when operating in the second operating mode.

3. The dual-mode power amplifier of claim 1, wherein the first NMOS transistor and the second NMOS transistor are configured to generate the single-ended output signal based, at least in part, on the intermediate differential signal when operating in the first operating mode.

4. The dual-mode power amplifier of claim 1, wherein the drain terminal of the first NMOS transistor is coupled to the supply voltage when operating in the first operating mode, and the drain terminal of the first NMOS transistor is coupled to ground when operating in the second operating mode.

5. The dual-mode power amplifier of claim 1, wherein a gate terminal of the second NMOS transistor is coupled to a first bias voltage when operating in the first operating mode, and is coupled to a reference voltage when operating in the second operating mode.

6. The dual-mode power amplifier of claim 1, further comprising:
a control block configured to generate a mode select signal for the first amplifier and the second amplifier based, at least in part, on an operating mode of the first amplifier and the second amplifier.

7. The dual-mode power amplifier of claim 6, wherein:
the control block is configured to drive the mode select signal to a first state indicating the first operating mode when a transmit output power is to be less than a threshold level; and
the control block is configured to drive the mode select signal to a second state indicating the second operating mode when the transmit output power is to be greater than or equal to the threshold level.

8. The dual-mode power amplifier of claim 1, wherein the first inductor and the second inductor are configured to function as a balun to couple the differential output of the second amplifier to the antenna.

9. The dual-mode power amplifier of claim 1, further comprising:
a third amplifier to amplify a differential input signal and generate the intermediate differential signal.

10. The dual-mode power amplifier of claim 1, wherein an operating mode of the first amplifier and the second amplifier is based, at least in part, on a transmit output power of the dual-mode power amplifier.

11. The dual-mode power amplifier of claim 1, wherein a gate terminal of the first NMOS transistor is configured to receive a first portion of the intermediate differential signal and a gate terminal of the second NMOS transistor is configured to receive a second portion of the intermediate differential signal.

12. A wireless communication device to amplify a communication signal, the device comprising:
a first transceiver; and
a dual-mode power amplifier, coupled to the first transceiver, comprising:
a first amplifier configured to amplify an intermediate differential signal and generate a single-ended output signal at an output terminal of the first amplifier when operating in a first operating mode, and configured to couple the output terminal of the first amplifier to ground when operating in a second operating mode, the first amplifier comprising:
a first NMOS transistor comprising a drain terminal coupled to at least one from the group consisting of a supply voltage and a ground, and a source terminal coupled to the output terminal of the first amplifier; and a second NMOS transistor comprising a drain terminal coupled to the source terminal of the first NMOS transistor and a source terminal coupled to ground;

a second amplifier configured to amplify the intermediate differential signal and generate a differential output signal at output terminals of the second amplifier when operating in the second operating mode; and an inductive coupler comprising:
a first inductor including a first terminal directly coupled to the output terminal of the first amplifier and a second terminal coupled to an antenna; and
a second inductor directly coupled across the output terminals of the second amplifier.

13. The wireless communication device of claim 12 further comprising bias circuitry configured to bias the first NMOS transistor and the second NMOS transistor to be in a saturation region when operating in the first operating mode and bias the first NMOS transistor and the second NMOS transistor to be in a triode region when operating in the second operating mode.

14. The wireless communication device of claim 12, wherein the first NMOS transistor and the second NMOS transistor are configured to generate the single-ended output signal based, at least in part, on the intermediate differential signal when operating in the first operating mode.

15. The wireless communication device of claim 12, wherein the drain terminal of the first NMOS transistor is coupled to the supply voltage when operating in the first operating mode, and the drain terminal of the first NMOS transistor is coupled to ground when operating in the second operating mode.

16. The wireless communication device of claim 12, wherein a gate terminal of the second NMOS transistor is coupled to a bias voltage when operating in the first operating mode, and is coupled to a supply voltage when operating in the second operating mode.

17. The wireless communication device of claim 12, wherein the first amplifier comprises:
a control block configured to generate a mode select signal for the first amplifier and the second amplifier based, at least in part, on an operating mode of the first amplifier and the second amplifier.

18. The wireless communication device of claim 12, further comprising:
a second transceiver, and
a selector configured to couple the first transceiver and the second transceiver to the dual-mode power amplifier, wherein the first transceiver is configured to transmit and receive communication signals according to a first protocol and the second transceiver is configured to transmit and receive communication signals according to a second protocol, different from the first protocol.

19. A method to amplify an input signal with a dual-mode power amplifier, the method comprising:
amplifying, by a first amplifier, an intermediate differential signal to generate a single-ended output signal at an output terminal of the first amplifier when operating in a first operating mode, and coupling the output terminal of the first amplifier to ground when operating in a second operating mode, the first amplifier comprising:

a first NMOS transistor comprising a drain terminal coupled to at least one from the group consisting of a supply voltage and a ground, and a source terminal coupled to the output terminal of the first amplifier; and a second NMOS transistor comprising a drain terminal coupled to the source terminal of the first NMOS transistor and a source terminal coupled to ground; and amplifying, by a second amplifier, the intermediate differential signal to generate a differential output signal at output terminals of the second amplifier when operating in the second operating mode, wherein the first amplifier and the second amplifier are coupled to an antenna by an inductive coupler comprising:
a first inductor including a first terminal directly coupled to the output terminal of the first amplifier and a second terminal coupled to the antenna; and
a second inductor directly coupled across the output terminals of the second amplifier.

20. The method of claim 19, further comprising:
amplifying, by a third amplifier, the input signal to generate the intermediate differential signal, wherein the input signal is a differential signal.

21. The method of claim 19, further comprising:
selecting either the first operating mode or the second operating mode based, at least in part, on a transmit output power of the dual-mode power amplifier.

22. The method of claim 21, wherein the transmit output power is based, at least in part, on a protocol of a communication signal to be amplified by the dual-mode power amplifier.

23. A non-transitory computer-readable medium storing instructions that, when executed by one or more processors of a wireless device, causes the wireless device to:
amplify, by a first amplifier of a dual-mode power amplifier, an intermediate differential signal to generate a single-ended output signal at an output terminal of the first amplifier when operating in a first operating mode, and couple the output terminal of the first amplifier to ground when operating in a second operating mode, the first amplifier comprising:
a first NMOS transistor comprising a drain terminal coupled to at least one from the group consisting of a supply voltage and a ground, and a source terminal coupled to the output terminal of the first amplifier; and
a second NMOS transistor comprising a drain terminal coupled to the source terminal of the first NMOS transistor and a source terminal coupled to ground; and
amplify, by a second amplifier, the intermediate differential signal to generate a differential output signal at output terminals of the second amplifier when operating in the second operating mode, wherein the first amplifier and the second amplifier are coupled to an antenna by an inductive coupler, comprising:
a first inductor including a first terminal directly coupled to the output terminal of the first amplifier and a second terminal coupled to the antenna; and
a second inductor directly coupled across the output terminals of the second amplifier.

24. The non-transitory computer-readable medium of claim 23, wherein execution of the instructions further causes the wireless device to:

amplify, by a third amplifier, an input signal to generate the intermediate differential signal, wherein the input signal is a differential signal.

25. The non-transitory computer-readable medium of claim 23, wherein execution of the instructions further causes the wireless device to:
select either the first operating mode or the second operating mode based, at least in part, on a transmit output power of the dual-mode power amplifier.

26. The non-transitory computer-readable medium of claim 25, wherein the transmit output power is based, at least in part, on a protocol of a communication signal to be amplified by the dual-mode power amplifier.

* * * * *